(12) United States Patent
Shimakura et al.

(10) Patent No.: US 8,410,438 B2
(45) Date of Patent: Apr. 2, 2013

(54) CHARGED PARTICLE BEAM DEVICE

(75) Inventors: Tomokazu Shimakura, Kawasaki (JP); Masaki Hasegawa, Sayama (JP)

(73) Assignee: Hitachi, Ltd., Tokyo (JP)

(*) Notice: Subject to any disclaimer, the term of this patent is extended or adjusted under 35 U.S.C. 154(b) by 156 days.

(21) Appl. No.: 13/099,438

(22) Filed: May 3, 2011

(65) Prior Publication Data

US 2011/0284746 A1 Nov. 24, 2011

(30) Foreign Application Priority Data

May 20, 2010 (JP) ................. 2010-116227

(51) Int. Cl.
*G01N 23/00* (2006.01)
*G21K 7/00* (2006.01)

(52) U.S. Cl. ............ 250/306; 250/307; 250/491.1; 250/492.2; 250/310; 250/397; 250/398

(58) Field of Classification Search ............ 250/306, 250/307, 491.1, 492.2, 310, 397, 398
See application file for complete search history.

(56) References Cited

U.S. PATENT DOCUMENTS 6,559,459 B2 * 5/2003 Tanaka et al. ............ 250/491.1

2002/0117635 A1 8/2002 Shinada et al.

FOREIGN PATENT DOCUMENTS

JP 9-293474 A 11/1997
JP 11-108864 A 4/1999

* cited by examiner

*Primary Examiner* — Jack Berman
*Assistant Examiner* — Meenakshi Sahu
(74) *Attorney, Agent, or Firm* — Mattingly & Malur, PC

(57) ABSTRACT

A charged particle beam device has a tilt detection unit that detects a tilt of a sample surface and an E×B deflector in which an electric field and a magnetic field are overlapped with each other and which causes, according to the detected tilt of the sample surface, the sample surface to be perpendicularly irradiated with an irradiation charged particle beam while, at the same time, aligning the trajectory of the charged particle beam with the optical axis centers of an irradiation optical system and an imaging optical system; thereby, the charged particle beam device can prevent problems possibly occurring in cases where a sample stage is tilted or a sample surface is undulating and can enable an accurate image to be acquired.

12 Claims, 9 Drawing Sheets

| | | TILT IN X DIRECTION | | | |
|---|---|---|---|---|---|
| | | $\theta_{xa}$ | ⋯ | 0 | ⋯ | $\theta_{xb}$ |
| TILT IN Y DIRECTION | $\theta_{Ya}$ | $E_1, B_1$ | ⋯ | $E_2, B_2$ | ⋯ | $E_3, B_3$ |
| | ⋮ | ⋮ | | ⋮ | | ⋮ |
| | 0 | $E_4, B_4$ | ⋯ | $E_5, B_5$ | ⋯ | $E_6, B_6$ |
| | ⋮ | ⋮ | | ⋮ | | ⋮ |
| | $\theta_{Yb}$ | $E_7, B_7$ | ⋯ | $E_8, B_8$ | ⋯ | $E_9, B_9$ |

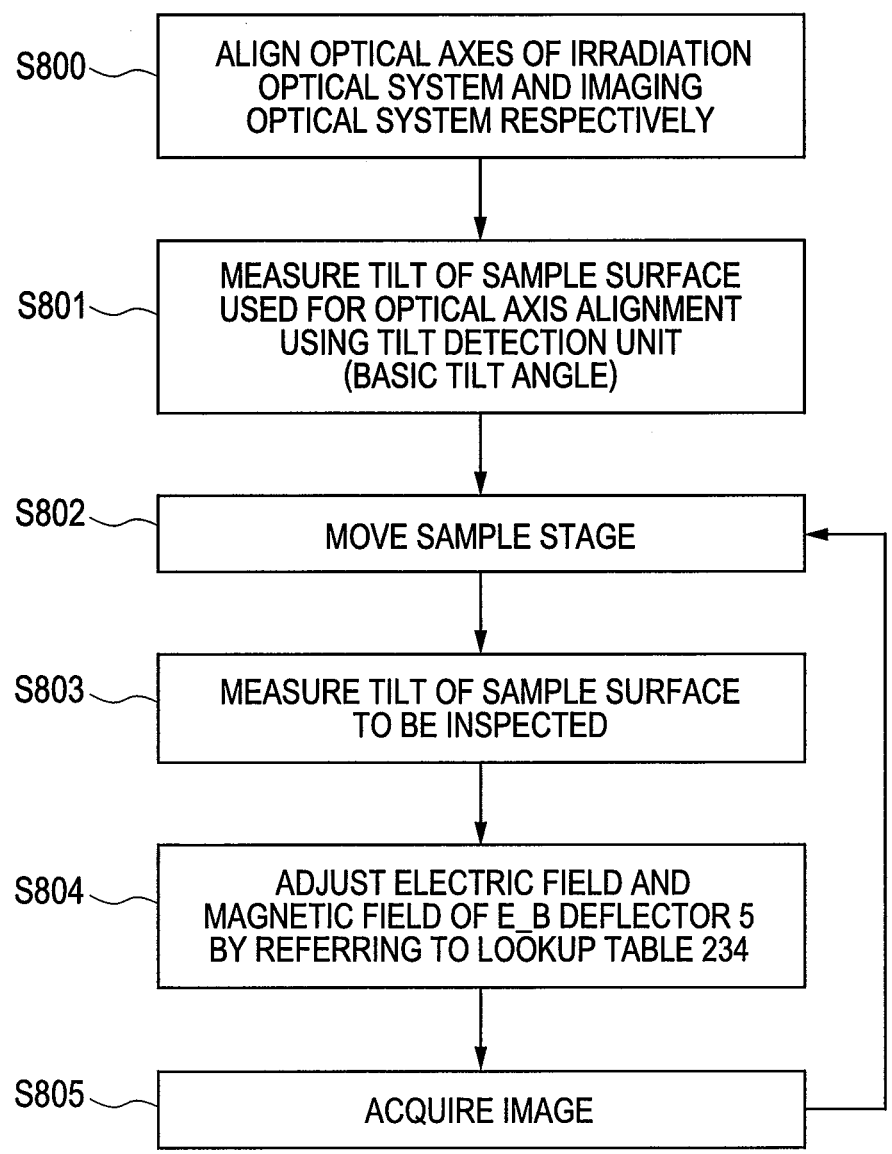

CHARGED PARTICLE BEAM DEVICE

CLAIM OF PRIORITY

The present application claims priority from Japanese patent application JP 2010-116227 filed on May 20, 2010, the content of which is hereby incorporated by reference into this application.

FIELD OF THE INVENTION

The present invention relates to a charged particle beam device, and more particularly, to a charged particle beam device suitable for observation and inspection of, for example, a semiconductor wafer and a magnetic recording medium used in a magnetic disk device.

BACKGROUND OF THE INVENTION

Inspection devices making use of an electron beam have been in use to detect, for example, foreign objects and circuit pattern defects on semiconductor wafers. Among such electron beam type inspection devices, those of a scanning electron beam type for scanning a sample with a point-converged electron beam have been mainstream devices.

In an electron beam type inspection device, to inspect a sample, i.e. a semiconductor wafer, with desired resolution and sensitivity without damaging the sample, the energy of an irradiation electron beam is controlled by applying a voltage to the semiconductor wafer. This voltage application is referred to as "retarding." Japanese Unexamined Patent Publication No. Hei11(1999)-108864 discloses an inspection device called a projection-type inspection device as an observation technique in which a retarding voltage is applied to a sample and in which an electron beam is made use of.

In the observation technique, a sample is, instead of being scanned with a point beam, irradiated with an areal beam which can cover a two-dimensional area of the sample so as to make inspection faster than when a technique making use of a scanning electron beam is used. In the technique, a negative retarding voltage whose absolute value is approximately the same as that of an acceleration voltage is applied to a sample, and an electron beam emitted toward the sample turns back immediately before colliding with the sample. This turning back of the electron beam occurs in an equipotential plane formed, above the sample, by the retarding voltage, and an image reflecting a contrast generated according to the tilt of the equipotential plane is formed.

When the retarding voltage is applied to the sample, an electric field is generated above the sample. When the sample is tilted, the electric field is also tilted. Normally, the electron beam is, by adjusting an electron optical lens, made incident perpendicularly on the sample assumed to be positioned horizontally. When the sample is not horizontally positioned, the trajectory of the electron beam deviates from the optical axis to cause, for example, beam shifting and image shading, making it difficult to obtain an accurate image for observation. Thus, a device which uses a charged particle beam and a retarding voltage can be affected by a disturbed electric field.

A technique in which the optical axis of an irradiation electron beam is corrected according to the tilt of a sample surface so as to make the irradiation electron beam orthogonal to the sample surface is disclosed in Japanese Unexamined Patent Publication No. Hei09 (1997)-293474. In this technique, a correction signal is superimposed on a deflection coil for electron beam scanning, and the electron beam is tilted so that its axis is orthogonal to the sample surface.

SUMMARY OF THE INVENTION

In the technique disclosed in Japanese Unexamined Patent Publication No. Hei09(1997)-293474, the optical axis of an irradiation electron beam is corrected using a deflection coil for scanning. The technique can make the irradiation electron beam incident perpendicularly on a sample surface. It is, however, difficult, using the technique, to make mirror electrons reflected from an equipotential plane travel along the optical axis center of a lens of an imaging optical system. The technique, therefore, cannot be applied to a projection type inspection device.

In the case of a projection-type inspection device, an areal electron beam is used as mentioned above, so that, to obtain an accurate image of a tilted sample surface, it is necessary not only to make an electron beam incident perpendicularly on the sample surface but also to make the irradiation electrons travel along the optical axis center of the irradiation optical system and further make the mirror electrons reflected at an equipotential plane travel along the optical axis center of the imaging optical system of the inspection device.

The inventors of the present invention noticed that there are cases where an accurate image cannot be obtained even when a sample is placed on a horizontal sample stage. By studying such cases, the inventors have found out that, with a projection-type device being very sensitive to a tilt of an equipotential plane, if the area to be observed of a sample placed on a horizontal stage is tilted by even as small as 0.1° due to, for example, surface undulation, large beam shifting is caused making it difficult to obtain an accurate image.

An object of the present invention is to provide, by solving the above problem, a charged particle beam device which can obtain an accurate image of an ample even when the sample stage is tilted or the sample surface is undulating.

According to a typical aspect of the present invention, a charged particle beam device includes a unit that detects a tilt of a sample surface to be measured and a charged particle control unit that makes, based on the detected tilt, an irradiation charged particle beam incident perpendicularly on the sample surface and aligns a trajectory of a charged particle beam with optical axis centers of an irradiation optical system and an imaging optical system. The charged particle beam device includes an irradiation optical system for irradiating a sample to be observed with a charged particle beam, an imaging optical system for making the charged particle beam emitted or reflected from the sample form an image, a mechanism for applying a voltage to the sample, and a sample stage for placing the sample on and moving the sample placed thereon.

According to the present invention, even when a sample stage is tilted or a sample to be observed has an undulating surface, it is possible to obtain an accurate image of the sample, so that the sample can be inspected to accurately detect pattern defects or foreign objects thereon.

BRIEF DESCRIPTION OF THE DRAWINGS

FIG. 8 is a flowchart showing a procedure for adjusting the electron beam adjustment unit according to the first embodiment of the present invention.

DETAILED DESCRIPTION OF THE PREFERRED EMBODIMENTS

In preferred embodiments of a charged particle beam device according to the present invention, a laser beam is reflected at a sample surface and a displacement of the laser beam reflected from the sample surface is measured to detect a tilt of the sample. According to the detected tilt of the sample, an E×B deflector in which an electric field and a magnetic field are overlapped is adjusted to cause an irradiation electron beam to be incident perpendicularly on the sample surface, making it possible to align the trajectory of the electron beam with the optical axis center of the irradiation optical system and the optical axis center of the imaging optical system.

According to the preferred embodiments, even when the surface of a sample is tilted, an accurate image can be obtained, so that pattern defects and foreign objects on the sample surface can be accurately detected.

Alternatively, the E×B deflector may be adjusted by detecting the tilt of a sample according to an interference image of the sample surface obtained using a differential interference microscope.

Still alternatively, the E×B deflector may be adjusted according to the surface profile of the sample detected using a probe put in contact with the sample surface.

The preferred embodiments of the present invention will be described below with reference to the accompanying drawings.

First Embodiment

Figure 1:
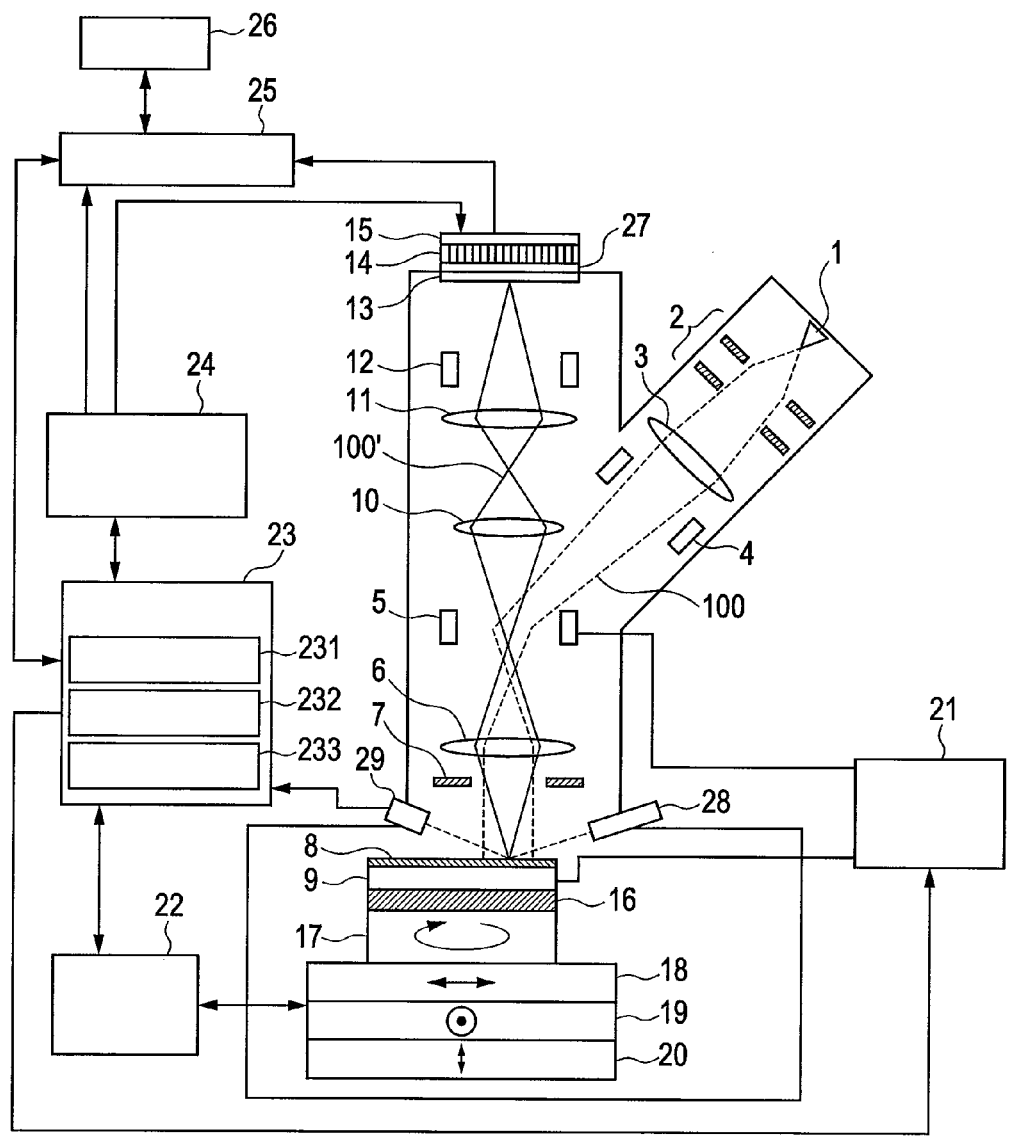
FIG. 1 is an overall configuration diagram for explaining an inspection device according to a first embodiment of the present invention.

An inspection device according to a first embodiment of the present invention will be described below with reference to FIGS. 1 to 4. FIG. 1 shows an overall configuration of the inspection device, i.e. a charged particle beam device, according to the present embodiment. The inspection device has, broadly divided, an electron beam irradiation optical system, a mirror electron imaging optical system, a stage mechanism system, an image detection system, and a control system. In FIG. 1, such components as a vacuum evacuation pump, a control device therefor, and exhaust tubing included in the inspection device are omitted. The electron beam irradiation optical system includes, for example, an electron source 1, an extraction electrode 2, a condenser lens 3, a condenser lens 3, a deflector 4, and a beam parallelizing unit as principal components. It may have various other components, but they will not be described in this specification. The mirror electron imaging optical system has a deflector (E×B deflector) 5 in which an electric field and a magnetic field are overlapped, an objective lens 6, a hole electrode 7, a sample stage 9, an intermediate lens 10, and a projection lens 11 as principal components. The mirror electron imaging optical system may also include various other components, but they will not be described in this specification.

In the electron beam irradiation optical system, a voltage is applied to the extraction electrode 2 allowing the extraction voltage and acceleration voltage for the irradiation electron beam 100 emitted from the electron source 1 to be adjusted. The irradiation electron beam 100 emitted from the electron source 1 forms a crossover by being condensed by the condenser lens 3 and deflected by the E×B deflector 5, then passes the objective lens 6 to hit, as a parallel flux (or as an electron beam having a specified sectional area), a sample 8.

The irradiation electron beam 100 is deflected by the E×B deflector 5 into an optical axis orthogonal to the surface of the sample 8. The E×B deflector 5 is effective only for an electron beam directed from the electron source to the sample and functions as a beam separator. The irradiation electron beam deflected by the E×B deflector 5 becomes a parallel flux by passing the objective lens 6 and hits an area with a spread of several tens of micrometers on the sample surface.

The sample 8 is impressed, by a power supply unit 21, with a negative voltage (retarding voltage) the absolute value of which is approximately equal to or slightly larger than that of the acceleration voltage. The irradiation electron beam is decelerated, by the retarding voltage, before hitting the sample 8 and is pulled back upwardly as mirror electrons 100'. The incident electrons do not touch the surface of the sample 8 or they touch the sample surface only slightly, so that electrical charges do not easily collect on the sample surface. Hence, the sample surface is not easily contaminated.

The mirror electrons 100' have information reflecting the potential distribution on the sample surface, i.e. information on the surface profile and the charged state, affected by material type, of the sample surface. The mirror electrons 100' are converged by the objective lens 6 and, with the E×B deflector 5 not affecting an electron beam directed from the sample side toward a fluorescent screen 13, rise vertically upward to pass the intermediate lens 10 and the projection lens 11 to be projected on the fluorescent screen 13. In FIG. 1, reference numeral 12 denotes a deflector of the imaging optical system.

The image detection system includes the fluorescent screen 13, an optical image transfer section 14, an optical image detection device 15, and a detector rotating mechanism 27, and converts the projected mirror electrons into an electrical signal. The optical image transfer section 14 may be made of a bunch of optical fibers. The optical image detector 15 maybe a CCD (charge coupled device) camera or TDI (time delay and integration) sensor. A TDI sensor is an imaging device capable of time-delayed integration imaging. For continuous imaging to be performed while rotating the sample 8, it is preferable to use a TDI sensor. When a TDI sensor is used as the optical image detector 15, the direction of pixel integration by the TDI sensor 15 and the direction of linear velocity vector of rotation of the image to be observed are made to coincide with each other using the detector rotating mechanism 27. Also, the speed of charge transfer by the TDI sensor 15 and the image moving speed on the light receiving surface are made to coincide with each other by adjusting the trigger signal outputted from an arbitrary signal generator 24 to the TDI sensor 15 and the rotating speed of the rotary stage 17.

An image processing unit 25 stores a design pattern of the structure of the sample 8. When the image processing unit 25 detects a defect in an acquired image, the defect signal is sent to a device control unit 23 and is stored as data correlated with position coordinates received from the rotary stage 17. The image referred to above includes, for example, an output signal of the optical image detector and two-dimensional intensity distribution data.

Operation commands and operation conditions for each section of the charged particle beam device are inputted and outputted via the device control unit 23. The device control unit 23 is an information processing device provided with, for example, a CPU, memory, and programs. The device control unit 23 includes an inspection section 231, a power supply adjustment section 232, and a storage section 233. The inspection section 231 has a function of observing and inspecting the sample 8. The power supply adjustment section 232 has a function of controlling the magnitude of deflection effected by the E×B deflector 5. The power supply adjustment section has a function of holding data related with such sections.

The image processing unit 25 is connected to a monitor 26, and an electron beam image or optical image captured thereby is outputted to the monitor 26 for display.

The stage mechanism system has a configuration in which a linear stage and the rotary stage are combined. Namely, the stage mechanism system includes an X-stage 18 and a Y-stage 19 which make up a linear stage for linearly moving a sample in an X-Y plane, a θ stage making up a rotary stage for rotating the sample in an X-Y plane, a Z-stage 20 for changing the position in the height (Z) direction of the sample, and a stage control unit 22 for controlling these stages. The stage mechanism system may be made up of the X-stage 18, the Y-stage 19 and a Z-stage 20 without including the rotary stage 17. In FIG. 1, reference numeral 16 denotes an insulator.

A laser light source 28 and a displacement detector 29 are provided to measure a tilt of the surface of an area to be inspected/observed of the sample 8. A laser beam emitted from the laser light source 28 is made to be reflected from the surface of an area to be inspected/observed of the sample 8, and a change, caused by tilting of the surface of an area to be inspected/observed of the sample, in the direction in which the laser beam is reflected is detected by the displacement detector 29. The amount of displacement detected by the displacement detector 28 is transmitted to the device control unit 23. The power supply adjustment section 232 then specifies the voltage and current values, determined based on the tilt of the surface of the area to be inspected/observed of the sample, to be applied to the E×B deflector 5 by the power supply unit 21. The power supply unit applies the specified values of voltage and current to the E×B deflector 5, causing the surface of the area to be inspected/observed of the sample 8 to be irradiated, always perpendicularly, with the irradiation electron beam 100. In cases where the sample stage on which a flat-surfaced sample is placed is tilted, tilt detection may be performed outside the area to be inspected/observed.

Figure 2A:
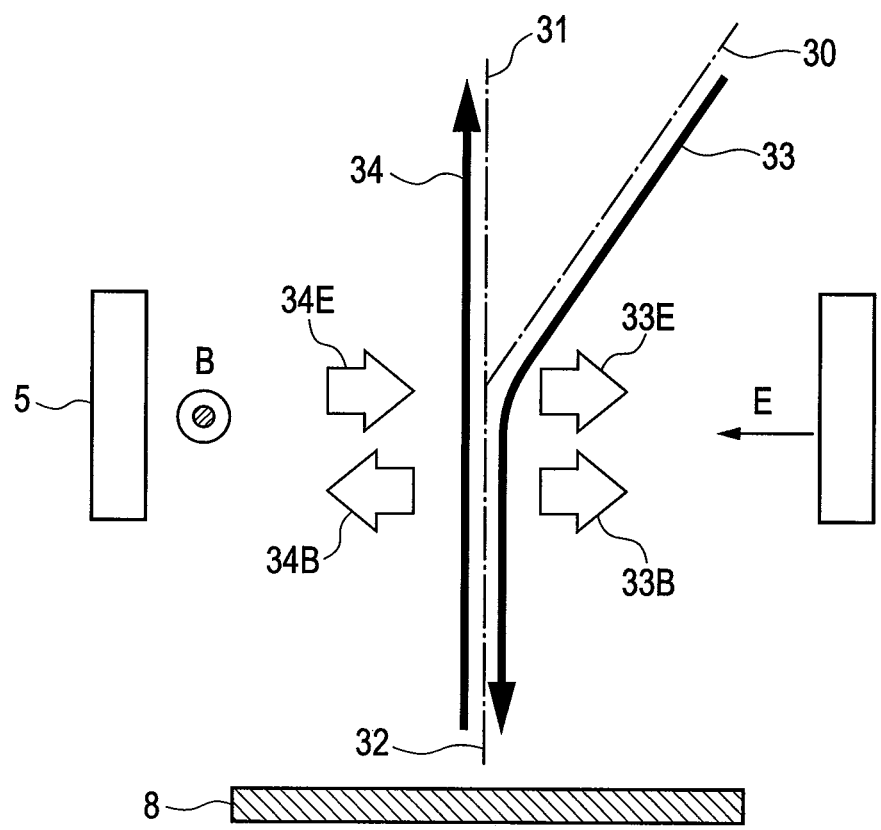
FIG. 2A is a schematic diagram showing an arrangement of an electron beam adjustment unit and a trajectory of an electron beam in a case where a sample surface is flat according to the first embodiment of the present invention.

The E×B deflector 5 according to the first embodiment will be described with reference to FIGS. 2A to 2D. FIG. 2A is a diagram showing relationship between the E×B deflector 5 and the sample 8 according to the first embodiment with the surface of the area to be inspected/observed of the sample being horizontal. The E×B deflector 5 is a deflector in which an electric field and a magnetic field are overlapped. As shown in FIG. 2A, when an electric field E is directed from the electron source side to the side away from the electron source (from right to left as seen on FIG. 2A) and a magnetic field B is applied perpendicularly to the electric field (from the back side toward the front side as seen on FIG. 2A), the irradiation electron beam 33 is subjected to the deflection effects of both the electric field and magnetic field for deflection into a direction (from left to right as seen in FIG. 2A) to irradiate, in a vertical direction 32, the surface of an area to be inspected/observed of the sample 8. Reference numeral 33E and 33B denote a force ($F_{EO}$) applied by the electric field to the irradiation electrons and a force ($F_{BO}$) applied by the magnetic field to the irradiation electrons, respectively.

The irradiation electron beam 33 is decelerated by a retarding voltage applied to the sample 8 and is pulled back upwardly as a mirror electron beam 34. Hence, in space on the sample side of the E×B deflector 5, the irradiation electron beam and the mirror electron beam are oppositely directed and have approximately identical energy distributions. The mirror electron beam 34 is not deflected by the E×B deflector 5 as the deflecting effects thereon of the electric field and magnetic field are mutually oppositely directed to nullify each other. The irradiation electron beam 33 is adjusted to travel along an optical axis 30 of the irradiation optical system, and the mirror electron beam 34 is adjusted to travel along an optical axis 31 of the imaging optical system. In FIG. 2A, reference numerals 34E and 34B denote a force ($F_{EO}$) applied to the mirror electron beam by an electric field and a force applied to the mirror electron beam by a magnetic field ($-F_{BO}$).

Figure 2B:
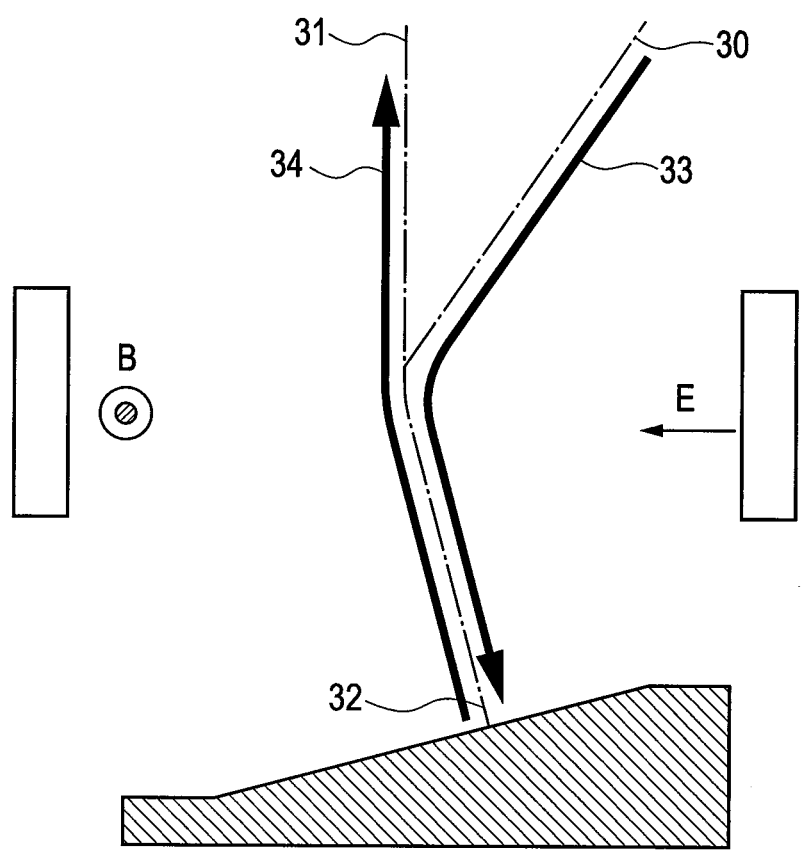
FIG. 2B is a schematic diagram showing an arrangement of the electron beam adjustment unit and a trajectory of an electron beam in a case where the sample surface is undulating according to the first embodiment of the present invention.
Figure 2C:
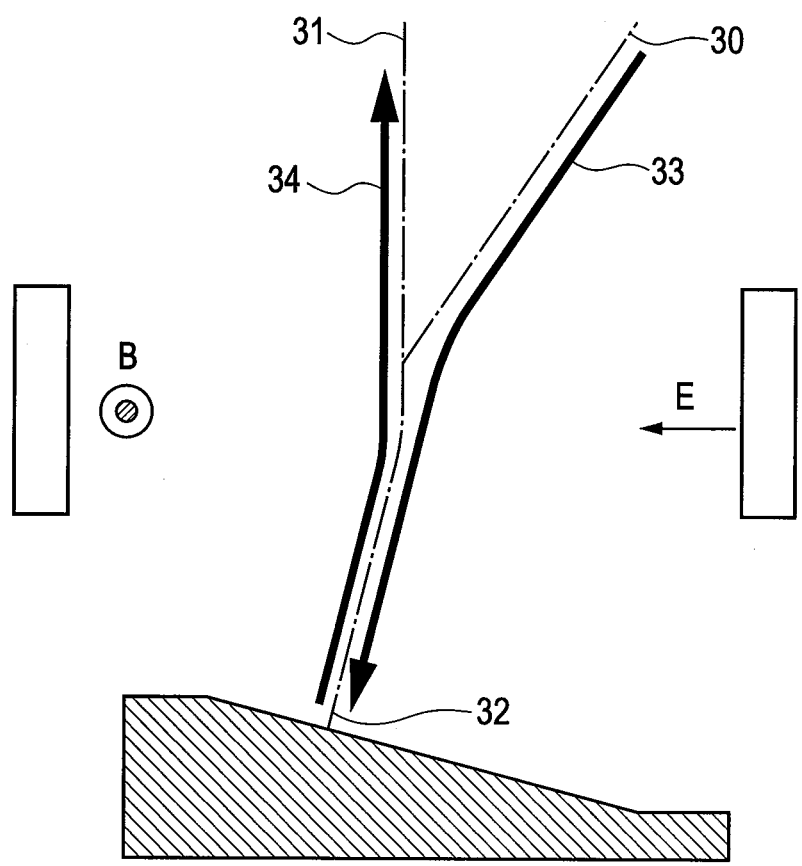
FIG. 2C is a schematic diagram showing an arrangement of the electron beam adjustment unit and a trajectory of an electron beam in a case where the sample surface is undulating in another manner according to the first embodiment of the present invention.
Figure 2D:
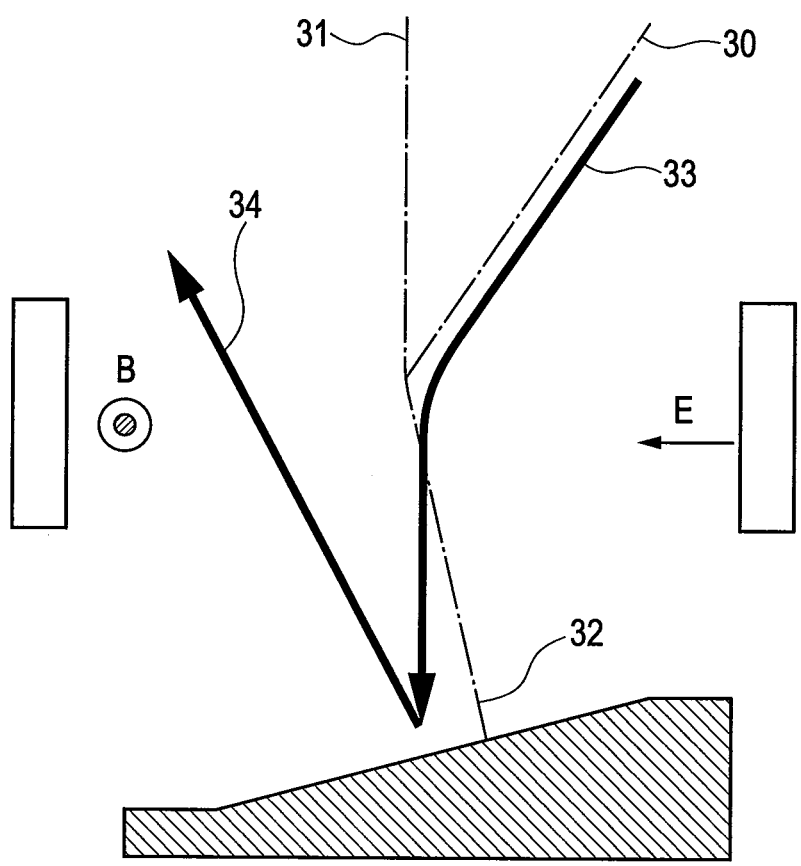
FIG. 2D is a schematic diagram showing a trajectory of an electron beam in a case where the sample surface is undulating with the electron beam adjustment unit arranged to be the same as in FIG. 2A with unchanged settings.

When the sample surface is undulating and the surface of an area to be inspected/observed of the sample is tilted, the irradiation electron beam 33 is, as shown in FIG. 2D, deviated from the direction 32 orthogonal to the area surface to be inspected/observed of the sample unless the setting of the E×B deflector 5 is appropriately changed from the state shown in FIG. 2A. In such a case, with the irradiation electron beam traveling diagonally relative to the area surface to be inspected/observed, the trajectory of the mirror electron beam 34 is widely deviated from the optical axis 31 of the imaging optical system, and it is difficult to obtain a mirror electron image.

The E×B deflector 5 can control the deflection angles thereat of the irradiation electron beam 33 and mirror electron beam 34 individually by controlling the electric field and magnetic field intensities. When the line normal to the surface of the area to be inspected/observed of the sample is tilted, as shown in FIG. 2B, away from the optical axis 30 of the irradiation optical system, the electric field is strengthened and, when the normal line is-tilted, as shown in FIG. 2C, toward the optical axis 30 of the irradiation optical system, the electric field is weakened. In this way, it is possible to keep the area to be inspected/observed of the sample 8 irradiated with the irradiation electron beam 33 in the direction 32 orthogonal thereto and let the mirror electron beam 34 travel upward along the optical axis 31 of the imaging optical system. This control is realized by controlling both the electric field and magnetic field generated by the E×B deflector 5 by adjusting the voltage and current applications thereto with an accuracy of about 1/1000.

The intensities of the electric field and magnetic field to be generated by the E×B deflector 5 to cause the mirror electron beam 34 to travel upward along the optical axis 31 of the imaging optical system while keeping the area to be inspected/observed of the sample 8 perpendicularly irradiated with the irradiation electron beam 33 are uniquely determined according to the tilt of the sample surface. That is, when the tilt of the sample surface is known, optimum settings of the E×B deflector 5 can be determined.

Figures 3, 4:
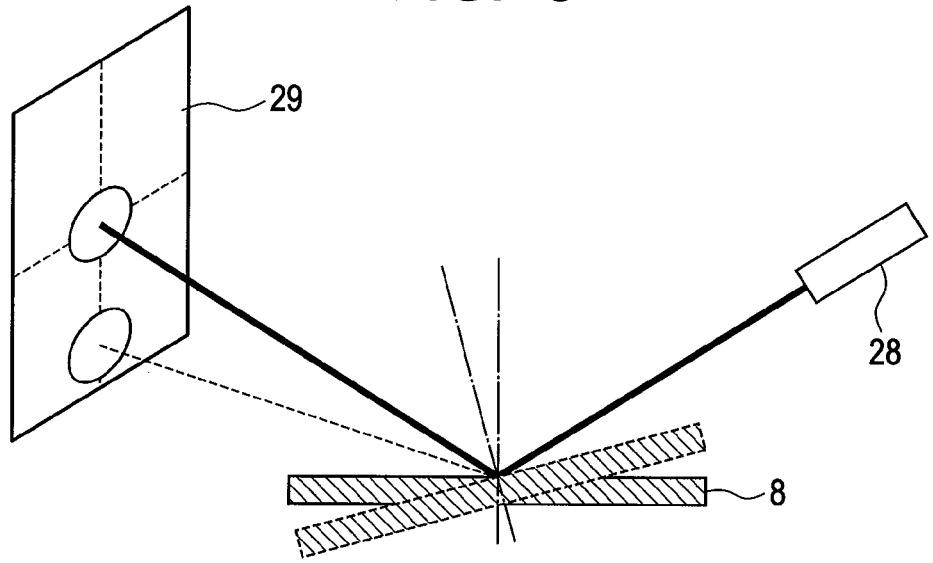
FIG. 3 is a schematic configuration diagram for explaining a unit that detects a sample tilt according to the first embodiment of the present invention.
FIG. 4 is a diagram showing an example lookup table showing relationship between the tilt angle of a sample and the electric field and magnetic field of the electron beam adjustment unit.

FIG. 3 is a schematic configuration diagram for explaining a unit that detects a sample tilt according to the first embodiment of the present invention. A laser beam generated by the laser light source 28 is reflected at the surface of the sample 8, and the reflected beam is detected by the displacement detector 29. The displacement detector 29 is divided into four or more parts and is set such that, when the surface of the sample 8 is horizontal, the reflected laser beam hits the center of the displacement detector 29. It is appropriate that the four or more parts of the displacement detector are each in contact with the center of the displacement detector 29.

When the surface of the area to be inspected/observed of the sample is tilted, the reflected laser beam does not precisely hit the center of the displacement detector 29, and the amounts of signals obtained from the divided parts of the displacement detector 29 change. The signals obtained from the displacement detector 29 are transmitted to the device control unit 23, and the device control unit 23 calculates the tilt of the sample surface based on the signals. The device control unit 23 calculates optimum settings of the E×B deflector 5 according to the tilt of the area surface to be inspected/observed of the sample and transmits the calculated settings to the power supply unit 21. The power supply unit 21 causes the E×B deflector 5 to generate an electric field and a magnetic field with intensities optimum for the tilted sample surface.

FIG. 4 is an example of a lookup table 234 showing the relationship between tilts of the sample surface in the X direction ($\theta_X$) and Y direction ($\theta_Y$) and the electric field and magnetic field settings ($E_n$, $B_n$) of the E×B deflector 5. The lookup table 234 is stored in the device control unit 23. The device control unit 23 determines, by referring to the lookup table 234, the optimum electric field and magnetic field settings based on the sample surface tilt detected by the displacement detector 29.

FIG. 8 is a flowchart showing a procedure for adjusting the E×B deflector 5. First, in step 800, an irradiation optical system control section (not shown) aligns the optical axis of the irradiation optical system, and an imaging optical system control section (not shown) aligns the optical axis of the imaging optical system. The sample to be referred to in aligning the optical axes may be the sample 8 to be inspected or a pattern for adjustment. The irradiation optical system control section and the imaging optical system control section may be disposed in the device control unit 23 or they may be provided as discrete units. In either case, the control sections are controlled by the device control unit 23.

In step 801, the tilt of the sample surface used for optical axis alignment is measured using a tilt detection unit. The tilt thus measured is referred to as a basic tilt angle. In step 802, the sample stage is moved to have an area to be inspected/observed of the sample 8 irradiated with an electron beam. In step 803, the tilt of the sample surface is measured using the tilt detection unit, and the difference between the tilt thus measured and the basic tilt angle is measured. In step 804, by referring to the lookup table 23 stored in the device control unit 23, the electric field and magnetic field of the E×B deflector 5 are adjusted to be optimum for the sample surface tilt. In step 805, an image is acquired and inspected. Subsequently steps 802 through 805 are repeated until the entire area to be inspected of the sample 8 has been inspected.

In observation of a magnetic recording medium for a magnetic disk device performed using a device according to the present embodiment, satisfactory images were acquired.

As described above, the present embodiment can provide a charged particle beam device which includes a unit that detects a tilt of an area to be inspected/observed of a sample and a unit that deflects, according to the detected tilt, an irradiation electron beam and a mirror electron beam. The charged particle beam device can therefore prevent problems which may occur in cases where a sample stage is tilted or a sample surface is undulating and can enable an accurate image to be acquired. The charged particle beam device according to the present embodiment uses a pair of a laser light source and a displacement detector as a tilt detection unit. Thus, the present embodiment can provide a simple-configured, easy-to-use, practical charged particle beam device.

Second Embodiment

An inspection device according to a second embodiment of the present invention will be described below with reference to FIG. 5. Note that what has been stated for the first embodiment but not stated for the second embodiment applies to the second embodiment, too, except in exceptional circumstances.

Figure 5:
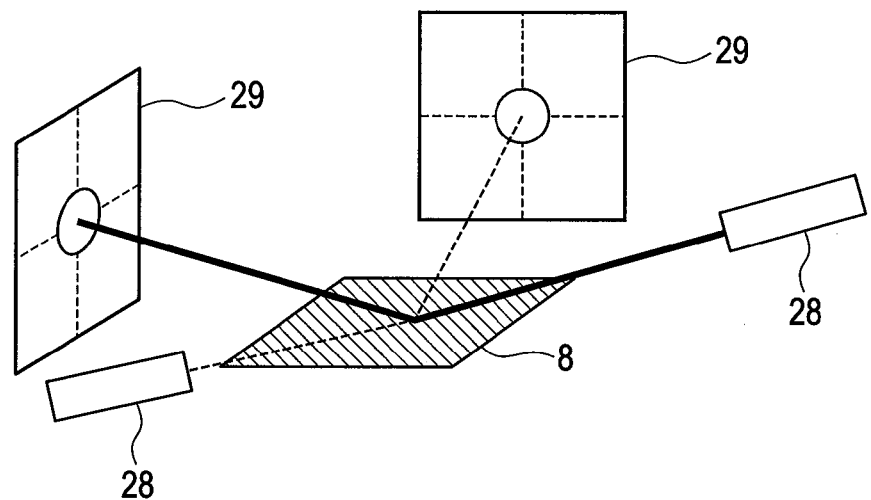
FIG. 5 is a schematic configuration diagram for explaining a unit that detects a sample tilt according to a second embodiment of the present invention.

FIG. 5 is a schematic configuration diagram for explaining a unit that detects a sample tilt according to the second embodiment of the present invention. The charged particle beam device according to the second embodiment has two or more tilt detection units for use in detecting a surface tilt of a sample area to be inspected/observed, each unit using a laser beam as in the first embodiment. Referring to FIG. 5, two laser light sources 28 are provided in an X-Y plane. It is appropriate that the surface of a sample area to be inspected/observed is irradiated with laser beams in two directions which are 90 degrees apart.

When the surface of the area to be inspected/observed of a sample is tilted and the height of the area is changed, it is difficult to detect the changes in tilt and height of the area using only one tilt detector. When, as shown in FIG. 5, a charged particle beam device is provided with two tilt detection units each making use of a laser beam, the tilt and height of the sample 8 can be individually detected by detecting signals received from the two displacement detectors 29 and making calculations using the detected signals. Based on the detected tilt of the sample 8, the electric field and magnetic field of the E×B deflector 5 are adjusted as in the first embodiment. Based on the change in height of the sample 8, the Z-stage 20 is adjusted to position the sample 8 at a desired height. This makes it possible to acquire an image with higher accuracy.

In observation of a magnetic recording medium for a magnetic disk device performed using a device according to the present embodiment, satisfactory images were acquired.

The present embodiment, like the first embodiment, can provide a charged particle beam device including a unit that detects a tilt of an area to be inspected/observed of a sample and a unit that deflects, according to the detected tilt, an irradiation electron beam and a mirror electron beam. The charged particle beam device can, therefore, prevent problems which may occur in cases where a sample stage is tilted or a sample surface is undulating and can enable an accurate image to be acquired. The charged particle beam device according to the present embodiment uses two pairs of laser light sources and displacement detectors as tilt detection units, so that, even when the height of a sample changes, changes in both tilt and height of the area to be inspected/observed of the sample can be detected.

Third Embodiment

An inspection device according to a third embodiment of the present invention will be described below with reference to FIG. 6. Note that what has been stated for the first embodiment but not stated for the third embodiment applies to the third embodiment, too, except in exceptional circumstances.

Figure 6:
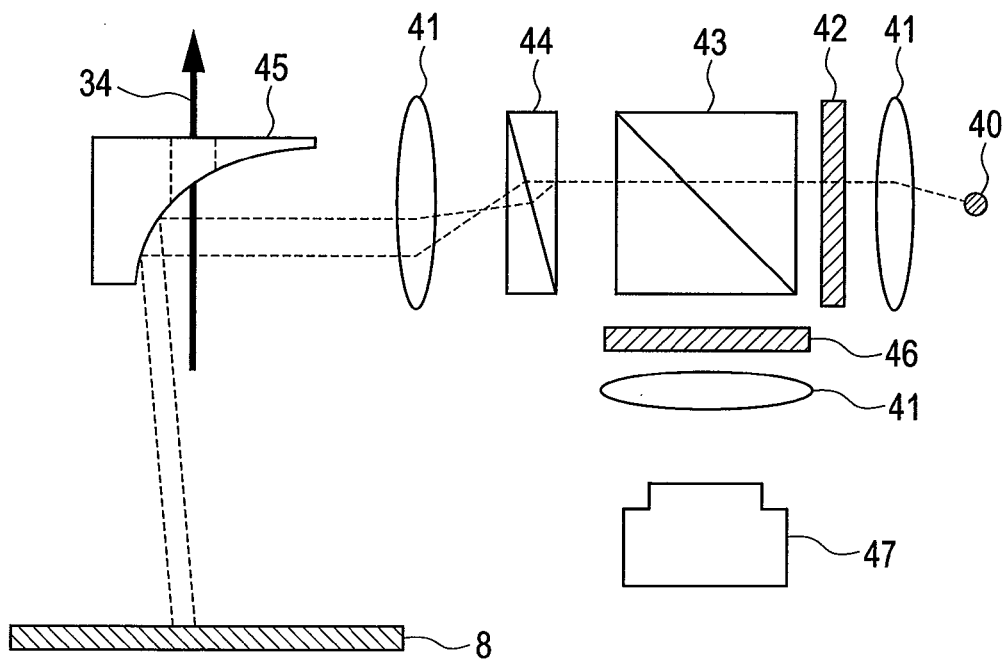
FIG. 6 is a schematic sectional structural diagram for explaining a unit that detects a sample tilt according to a third embodiment of the present invention.

FIG. 6 is a sectional view of a portion around a sample stage of a charged particle beam device according to the third embodiment. In the third embodiment, a differential interference microscope is used as a tilt detection unit. A light beam emitted from a light source 40 is deflected by a polarizer 42 which is a polarizing plate and enters a Wollaston prism 44 to be divided into two beams to travel along two optical paths. The two light beams are reflected by a mirror 45 and hit the surface of a sample 8 to be reflected therefrom.

When the two light beams reflected from the surface of the sample 8 pass the Wollaston prism 44 again, they are merged into one light beam which enters a beam splitter 43 to be reflected therefrom. The light beam reflected from the beam splitter 43 passes an analyzer 46 which is a deflection plate and is eventually acquired by a camera 47. In cases where the sample surface is tilted, the two light beams formed by the Wollaston prism 44 include an optical path difference, so that, when they are merged again, the merged light beam shows a differential interference image generated by interference. The tilt of the sample surface can be measured by observing and analyzing the differential interference image.

The mirror 45 has a through-hole formed to allow an electron beam to pass through. This makes it possible to observe a sample surface using an electron beam while also measuring the tilt of the sample surface based on interference light. In FIG. 6, reference numeral 41 denotes a lens.

Based on the measured tilt of the sample surface, the device control unit 23 calculates optimum settings of the E×B deflector 5 and makes the E×B deflector 5 generate, using the settings, an electric field and a magnetic field. When a differential interference microscope is used, it is difficult to determine the direction of a tilt of a sample. In such cases, it is advisable to acquire an image of a sample tilted in one direction, then acquire another image of the sample tilted in another direction.

In observation of a magnetic recording medium for a magnetic disk device performed using a device according to the present embodiment, satisfactory images were acquired.

The present embodiment, like the first embodiment, can provide a charged particle beam device including a unit that detects a tilt of an area to be inspected/observed of a sample and a unit that deflects, according to the detected tilt, an irradiation electron beam and a mirror electron beam. The charged particle beam device can therefore prevent problems which may occur in cases where a sample stage is tilted or a sample surface is undulating and can enable an accurate image to be acquired. The charged particle beam device according to the present embodiment uses a differential interference microscope as a tilt detection unit, so that a tilt can be detected with higher sensitivity than in cases where a laser light source and a displacement detector are used.

Fourth Embodiment

An inspection device according to a fourth embodiment of the present invention will be described below with reference to FIG. 7. Note that what has been stated for the first embodiment but not stated for the fourth embodiment applies to the fourth embodiment, too, except in exceptional circumstances.

Figure 7:
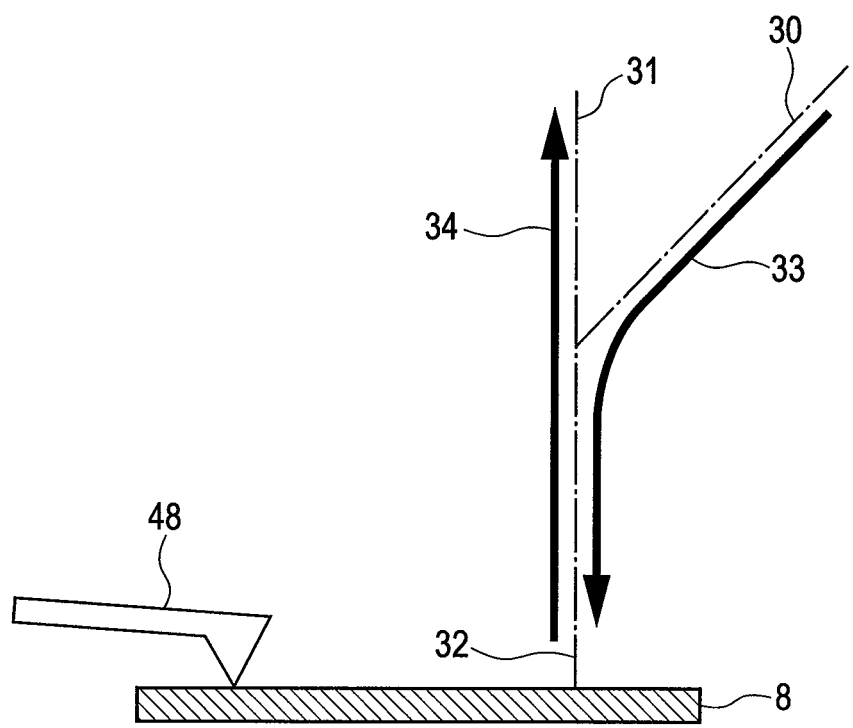
FIG. 7 is a schematic sectional structural diagram for explaining a unit that detects a sample tilt according to a fourth embodiment of the present invention.

FIG. 7 is a sectional view of a portion around a sample stage of a charged particle beam device according to the fourth embodiment. In the fourth embodiment, a probe 48 is used as a tilt detection unit. The probe 48 is put in contact with a surface portion away from the area to be observed using an irradiation electron beam of the sample and is scanned over the sample surface to measure the surface profile. The surface profile thus measured and surface coordinates of the sample 8 are recorded in the device control unit 23. When the sample 8 is to be observed using the irradiation electron beam 33, the device control unit 23 reads out the surface profile of the portion to be observed of the sample, calculates, based on the tilt of the sample 8, optimum settings of the E×B deflector 5, and makes the E×B deflector 5 generate, using the settings, an electric field and a magnetic field.

In observation of a magnetic recording medium for a magnetic disk device performed using a device according to the present embodiment, satisfactory images were acquired.

The present embodiment, like the first embodiment, can provide a charged particle beam device including a unit that detects a tilt of an area to be inspected/observed of a sample and a unit that deflects, according to the detected tilt, an irradiation electron beam and a mirror electron beam. The charged particle beam device can, therefore, prevent problems which may occur in cases where a sample stage is tilted or a sample surface is undulating and can enable an accurate image to be acquired. The charged particle beam device according to the present embodiment uses a probe as a tilt detection unit, so that a tilt can be detected with higher sensitivity than in cases where a differential interference microscope is used.

Even though, the first to fourth embodiments have been described as techniques based on a projection system in which an irradiation electron beam to irradiate a sample is an areal beam, a charged particle beam device based on a scanning electron beam system or using a charged particle beam such as an ion beam can also individually control, by using an E×B deflector, the trajectories of an irradiation charged particle beam and a secondary electron beam generated by a sample, so that such a device also makes it possible to acquire an accurate image with shading suppressed even for a sample whose surface is tilted.

The present invention has been described in detail. Exemplary embodiments of the invention are set forth below.

(1) A charged particle beam device includes: a charged particle generation source; an irradiation optical system that irradiates a sample to be observed with a first charged particle beam of charged particles generated by the charged particle generation source; an imaging optical system that makes a second charged particle beam form an image, the second charged particle beam being emitted or reflected from the sample irradiated with the first charged particle beam; a sample stage that places the sample on and moves the sample placed thereon; a tilt detection unit that detects a surface tilt of the sample; and a charged particle beam control unit that makes the first charged particle beam incident perpendicularly on the sample and that aligns a trajectory of the first charged particle beam with an optical axis center of the irradiation optical system and a trajectory of the second charged particle beam with an optical axis center of the imaging optical system.

(2) A charged particle beam device has a charged particle generation source, a sample stage on which a sample to be irradiated with a first charged particle beam of charged particles generated at the charged particle generation source is placed, an irradiation optical system that irradiates the sample with the first charged particle beam, an imaging optical system that makes a second charged particle beam emitted or reflected from the sample irradiated with the first charged particle beam form an image, a beam detection unit that detects the second charged particle beam having formed an image, an irradiation optical system control section that controls the irradiation optical system, an imaging optical system control section that controls the imaging optical system, a stage control unit that controls the sample stage, an image processing unit that acquires an image from a signal detected by the beam detection unit, and a device control unit that systematically controls the irradiation optical system control section, the imaging optical system control section, the stage control unit, and the image processing unit. The charged particle beam device includes: a tilt detection unit that detects a surface tilt of the sample; a charged particle beam control unit in which an electric field and a magnetic field are overlapped with each other, which makes the first charged particle beam incident perpendicularly on the sample according to a surface tilt of the sample detected by the tilt detection unit and which deflects the first charged particle beam to align a trajectory thereof with an optical axis center of the irradiation optical system and the second charged particle beam to align a trajectory thereof with an optical axis center of the imaging optical system; and a power supply unit that supplies electric power to the charged particle beam control unit. In the charged particle beam device, the irradiation optical system control section aligns an optical axis of the irradiation optical system using a first sample; the imaging optical system control section aligns an optical axis of the imaging optical system using the first sample; the device control unit adjusts, according to a surface tilt detected by the tilt detection unit of a second sample to be observed, an electric field and a magnetic field of the charged particle beam control unit by referring to a lookup table and controlling the power supply unit such that the first charged particle beam is incident perpendicularly on the surface of the second sample, such that a trajectory of the first charged particle beam is aligned with an optical axis center of the irradiation optical system, and such that a trajectory of the second charged particle beam is aligned with an optical axis center of the imaging optical system; the beam detection unit detects the second charged particle beam deflected so as to travel along the optical axis center of the imaging optical system; and the image processing unit acquires an image based on a signal detected by the beam detection unit.

What is claimed is:

1. A charged particle beam device, comprising:
   a charged particle generation source;
   an irradiation optical system that irradiates a sample to be observed with a first charged particle beam of charged particles generated by the charged particle generation source;
   an imaging optical system that makes a second charged particle beam form an image, the second charged particle beam being emitted or reflected from the sample irradiated with the first charged particle beam;
   a sample stage that places the sample on and moves the sample placed thereon;
   a tilt detection unit that detects a surface tilt of the sample; and
   a charged particle beam control unit that makes the first charged particle beam incident perpendicularly on the sample and that aligns a trajectory of the first charged particle beam with an optical axis center of the irradiation optical system and a trajectory of the second charged particle beam with an optical axis center of the imaging optical system.

2. The charged particle beam device according to claim 1, wherein the tilt detection unit includes a laser light source and a displacement detector.

3. The charged particle beam device according to claim 2, wherein the displacement detector is divided into a plurality of photodetectors.

4. The charged particle beam device according to claim 1, wherein the tilt detection unit detects a surface tilt of an area to be inspected/observed of the sample.

5. The charged particle beam device according to claim 1, wherein the tilt detection unit includes two or more pairs of laser light sources and displacement detectors.

6. The charged particle beam device according to claim 1, wherein the tilt detection unit includes a differential interference microscope.

7. The charged particle beam device according to claim 1, wherein the tilt detection unit includes a probe which contacts a surface of the sample.

8. The charged particle beam device according to claim 1, wherein the charged particle beam control unit is a deflector in which an electric field and a magnetic field are overlapped with each other, the electric field and the magnetic field being adjusted according to the tilt of the sample such that: the first charged particle beam is incident perpendicularly on the sample; the first charged particle beam travels along the optical axis center of the irradiation optical system; and the second charged particle beam travels along the optical axis center of the imaging optical system.

9. The charged particle beam device according to claim 1, further comprising a voltage application unit that applies a voltage to the sample.

10. A charged particle beam device having a charged particle generation source, a sample stage on which a sample to be irradiated with a first charged particle beam of charged particles generated at the charged particle generation source is placed, an irradiation optical system that irradiates the sample with the first charged particle beam, an imaging optical system which makes a second charged particle beam emitted or reflected from the sample irradiated with the first charged particle beam form an image, a beam detection unit that detects the second charged particle beam having formed an image, an irradiation optical system control section that controls the irradiation optical system, an imaging optical system control section that controls the imaging optical system, a stage control unit that controls the sample stage, an image processing unit that acquires an image from a signal detected by the beam detection unit, and a device control unit that systematically controls the irradiation optical system control section, the imaging optical system control section, the stage control unit and the image processing unit, the charged particle beam device comprising:
   a tilt detection unit that detects a surface tilt of the sample;
   a charged particle beam control unit in which an electric field and a magnetic field are overlapped with each other, which makes the first charged particle beam incident perpendicularly on the sample according to a surface tilt of the sample detected by the tilt detection unit and which deflects the first charged particle beam to align a trajectory thereof with an optical axis center of the irradiation optical system and the second charged particle beam to align a trajectory thereof with an optical axis center of the imaging optical system; and
   a power supply unit that supplies electric power to the charged particle beam control unit;
   wherein the irradiation optical system control section aligns an optical axis of the irradiation optical system using a first sample;

wherein the imaging optical system control section aligns an optical axis of the imaging optical system using the first sample;

wherein the device control unit adjusts, according to a surface tilt detected by the tilt detection unit of a second sample to be observed, an electric field and a magnetic field of the charged particle beam control unit by referring to a lookup table and controlling the power supply unit such that the first charged particle beam is incident perpendicularly on the surface of the second sample, such that a trajectory of the first charged particle beam is aligned with an optical axis center of the irradiation optical system, and such that a trajectory of the second charged particle beam is aligned with an optical axis center of the imaging optical system;

wherein the beam detection unit detects the second charged particle beam deflected so as to travel along the optical axis center of the imaging optical system; and wherein the image processing unit acquires an image based on a signal detected by the beam detection unit.

11. The charged particle beam device according to claim 10, wherein the tilt detection unit detects a surface tilt of an area to be inspected/observed of the second sample.

12. The charged particle beam device according to claim 10, wherein the sample stage has a voltage applied thereto.

* * * * *